US008737159B2

(12) United States Patent
Song

(10) Patent No.: US 8,737,159 B2
(45) Date of Patent: May 27, 2014

(54) SEMICONDUCTOR MEMORY DEVICE AND METHOD FOR DRIVING THE SAME

(75) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 187 days.

(21) Appl. No.: 13/313,159

(22) Filed: Dec. 7, 2011

(65) Prior Publication Data

US 2013/0083617 A1   Apr. 4, 2013

(30) Foreign Application Priority Data

Oct. 4, 2011   (KR) ........................ 10-2011-0100850

(51) Int. Cl.
*G11C 8/00*   (2006.01)

(52) U.S. Cl.
USPC .................................. 365/230.08; 365/233.18

(58) Field of Classification Search
USPC ........................................ 365/230.08, 233.18
See application file for complete search history.

(56) References Cited

U.S. PATENT DOCUMENTS

| | | | | |
|---|---|---|---|---|
| 6,006,313 A * | 12/1999 | Fukumoto | ...................... | 711/211 |
| 6,809,988 B2 * | 10/2004 | Sugiyama | ................ | 365/230.06 |
| 6,885,589 B2 * | 4/2005 | Cioaca | ...................... | 365/185.23 |
| 7,079,439 B2 * | 7/2006 | Cowles et al. | ................ | 365/222 |
| 8,358,558 B2 * | 1/2013 | Lee et al. | .................. | 365/230.06 |

FOREIGN PATENT DOCUMENTS

| | | |
|---|---|---|
| KR | 1020060024151 | 3/2006 |
| KR | 1020060032671 | 4/2006 |
| KR | 1020090107829 | 10/2009 |

* cited by examiner

*Primary Examiner* — Vanthu Nguyen

(74) *Attorney, Agent, or Firm* — IP & T Group LLP

(57) ABSTRACT

A semiconductor memory device includes a plurality of address input blocks configured to respectively receive a plurality of addresses that are related to burst ordering and a control circuit configured to selectively disable all or a part of the address input blocks in response to a burst length information during a write operation mode.

20 Claims, 8 Drawing Sheets

FIG. 2
(PRIOR ART)

| Burst Length | READ/ WRITE | Starting Column ADDRESS (A2,A1,A0) | burst type = Sequential (decimal) A3=0 | burst type = Interleaved (decimal) A3=1 | Notes |
|---|---|---|---|---|---|
| 4 Chop | READ | 000 | 0,1,2,3,T,T,T,T | 0,1,2,3,T,T,T,T | 1,2,3 |
| | | 001 | 1,2,3,0,T,T,T,T | 1,0,3,2,T,T,T,T | 1,2,3 |
| | | 010 | 2,3,0,1,T,T,T,T | 2,3,0,1,T,T,T,T | 1,2,3 |
| | | 011 | 3,0,1,2,T,T,T,T | 3,2,1,0,T,T,T,T | 1,2,3 |
| | | 100 | 4,5,6,7,T,T,T,T | 4,5,6,7,T,T,T,T | 1,2,3 |
| | | 101 | 5,6,7,4,T,T,T,T | 5,4,7,6,T,T,T,T | 1,2,3 |
| | | 110 | 6,7,4,5,T,T,T,T | 6,7,4,5,T,T,T,T | 1,2,3 |
| | | 111 | 7,4,5,6,T,T,T,T | 7,6,5,4,T,T,T,T | 1,2,3 |
| | WRITE | 0,V,V | 0,1,2,3,X,X,X,X | 0,1,2,3,X,X,X,X | 1,2,4,5 |
| | | 1,V,V | 4,5,6,7,X,X,X,X | 4,5,6,7,X,X,X,X | 1,2,4,5 |
| 8 | READ | 000 | 0,1,2,3,4,5,6,7 | 0,1,2,3,4,5,6,7 | 2 |
| | | 001 | 1,2,3,0,5,6,7,4 | 1,0,3,2,5,4,7,6 | 2 |
| | | 010 | 2,3,0,1,6,7,4,5 | 2,3,0,1,6,7,4,5 | 2 |
| | | 011 | 3,0,1,2,7,4,5,6 | 3,2,1,0,7,6,5,4 | 2 |
| | | 100 | 4,5,6,7,0,1,2,3 | 4,5,6,7,0,1,2,3 | 2 |
| | | 101 | 5,6,7,4,1,2,3,0 | 5,4,7,6,1,0,3,2 | 2 |
| | | 110 | 6,7,4,5,2,3,0,1 | 6,7,4,5,2,3,0,1 | 2 |
| | | 111 | 7,4,5,6,3,0,1,2 | 7,6,5,4,3,2,1,0 | 2 |
| | WRITE | V,V,V | 0,1,2,3,4,5,6,7 | 0,1,2,3,4,5,6,7 | 2,4 |

# SEMICONDUCTOR MEMORY DEVICE AND METHOD FOR DRIVING THE SAME

CROSS-REFERENCE TO RELATED APPLICATIONS

The present application claims priority of Korean Patent Application No. 10-2011-0100850, filed on Oct. 4, 2011, which is incorporated herein by reference in its entirety.

BACKGROUND

1. Field

Exemplary embodiments of the present invention relate to a semiconductor designing technology, and more particularly, to a semiconductor memory device and a method for driving the semiconductor memory device.

2. Description of the Related Art

In general, a semiconductor memory device such as a Dynamic Random Access Memory (DRAM) device includes a buffer for transforming an external input signal, e.g., a signal of a Transistor-Transistor Logic (TTL) level, into an internal signal of the semiconductor memory device, e.g., a signal of a CMOS level. The buffer includes a command buffer for buffering an external command and outputting an internal command and an address buffer for buffering an external address and outputting an internal address.

FIG. 1 is a block view illustrating a conventional semiconductor memory device.

Referring to FIG. 1, the conventional semiconductor memory device includes a plurality of address buffers BUF1 and BUF2 for buffering a plurality of addresses A<18:0> that are inputted from the outside and outputting a plurality of internal addresses PA<18:0>, and a command buffer BUF3 for buffering an external command CMDB and outputting an internal command PCMD. Here, two address buffers BUF1 and BUF2 are illustrated for illustration purposes, but the address buffers BUF1 and BUF2 are provided corresponding to the addresses A<18:0> one-to-one.

Meanwhile, the address buffers BUF1 and BUF2 and the command buffer BUF3 maintain an enabled state in response to an enable signal BUFEN regardless of a read/write operation mode.

Here, the conventional semiconductor memory device having the above-described structure has the following features.

FIG. 2 shows a table describing Burst Ordering Specification according to a read/write operation mode.

Referring to FIG. 2, the $0^{th}$, first and second addresses A<0:2> are received and used during a read operation mode to perform a burst ordering control regardless of a burst length. On the other hand, when a burst length is 4 during a write operation mode, the second address A<2> is received and used among the $0^{th}$, first and second addresses A<0:2>.

FIG. 3 shows a timing diagram of a conventional semiconductor memory device in a write operation mode.

Referring to FIG. 3, it may be seen that a data is inputted through a data pad DQ after a write command WT is inputted and a CAS Write Latency (CWL) passes. Here, since the enable signal BUFEN maintains the enabled state in a logic high level continuously, all the address buffers BUF1 and BUF2 maintain the enabled state.

Therefore, the conventional semiconductor memory device incurs excessive power consumption because the address buffer BUF1 or BUF2 for receiving a particular address A<0:1> or A<0:2> is enabled all the time, although the conventional semiconductor memory device does not use the particular address A<0:1> or A<0:2> during a write operation mode.

SUMMARY

An embodiment of the present invention is directed to a semiconductor memory device in which a buffer that is not used is disabled during a write operation mode, and a method for driving the semiconductor memory device.

Another embodiment of the present invention is directed to a semiconductor memory device in which a buffer that is not used is disabled according to a burst length during a write operation mode, and a method for driving the semiconductor memory device.

In accordance with an embodiment of the present invention, a semiconductor memory device includes: a plurality of address input blocks configured to respectively receive a plurality of addresses that are related to burst ordering; and a control circuit configured to selectively disable all or a part of the address input blocks in response to a burst length information during a write operation mode.

In accordance with another embodiment of the present invention, a semiconductor integrated circuit includes: at least one first address input block configured to receive a part of a plurality of addresses that are related to burst ordering and to be selectively enabled in response to a first enable signal in a write operation mode; at least one second address input block configured to receive the other part of the addresses that are related to burst ordering and to be selectively disabled in response to a second enable signal in the write operation mode; at least one third address input block configured to receive addresses other than the addresses that are related to burst ordering and to be continuously enabled in response to a third enable signal in the write operation mode; a control signal generator configured to generate a control signal that is enabled in a first period in response to a burst length information, CAS write latency information, a write command, and a clock; and an enable signal generator configured to generate a first enable signal and a second enable signal in response to the control signal, the third enable signal, the burst length information, and an active signal, which is a signal enabled when all banks are in an active state.

In accordance with yet another embodiment of the present invention, a method for driving a semiconductor memory device that includes at least one first address input block and at least one second address input block that are continuously enabled according to a first enable signal and a second enable signal in a read operation mode, the method which includes: when all banks are in an enabled state and a write command is inputted from outside, maintaining the first enable signal in an enabled state or transitioning the first enable signal from an enabled state to a disabled state in response to a burst length information, and transitioning the second enable signal from an enabled state to a disabled state in response to the burst length information; and when an input of a data corresponding to the burst length information from outside is completed, maintaining the first enable signal in an enabled state or transitioning the first enable signal from a disabled state to an enabled state, and transitioning the second enable signal from a disabled state to an enabled state.

BRIEF DESCRIPTION OF THE DRAWINGS

FIG. 2 shows a table describing Burst Ordering Specification according to a read/write operation mode to describe the problems of the conventional semiconductor memory device.

DETAILED DESCRIPTION

Figure 1:
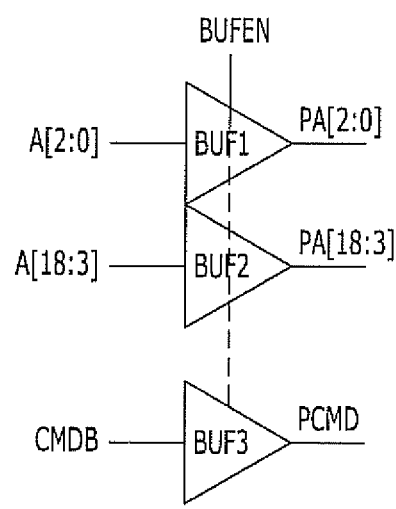
FIG. 1 is a block view illustrating a conventional semiconductor memory device.
Figure 3:
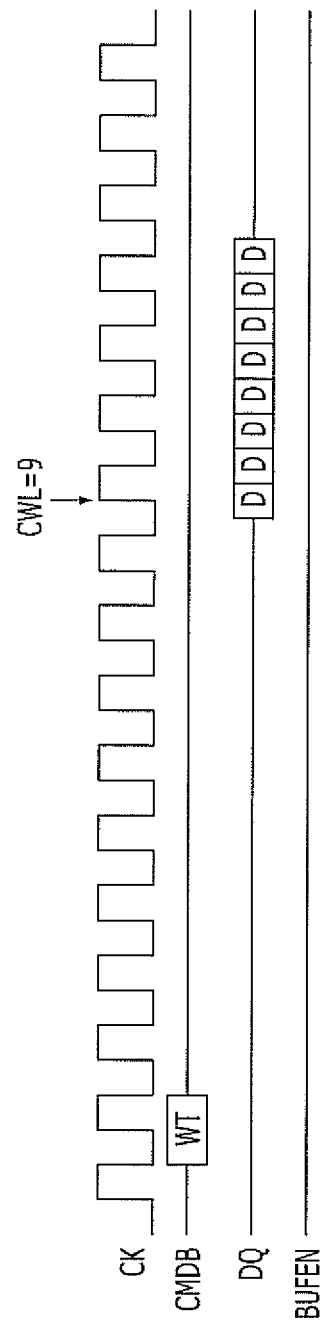
FIG. 3 shows a timing diagram of a conventional semiconductor memory device in a write operation mode.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In an embodiment of the present invention, it is assumed that a burst length is 4 or 8 for illustration purposes.

Figure 4:
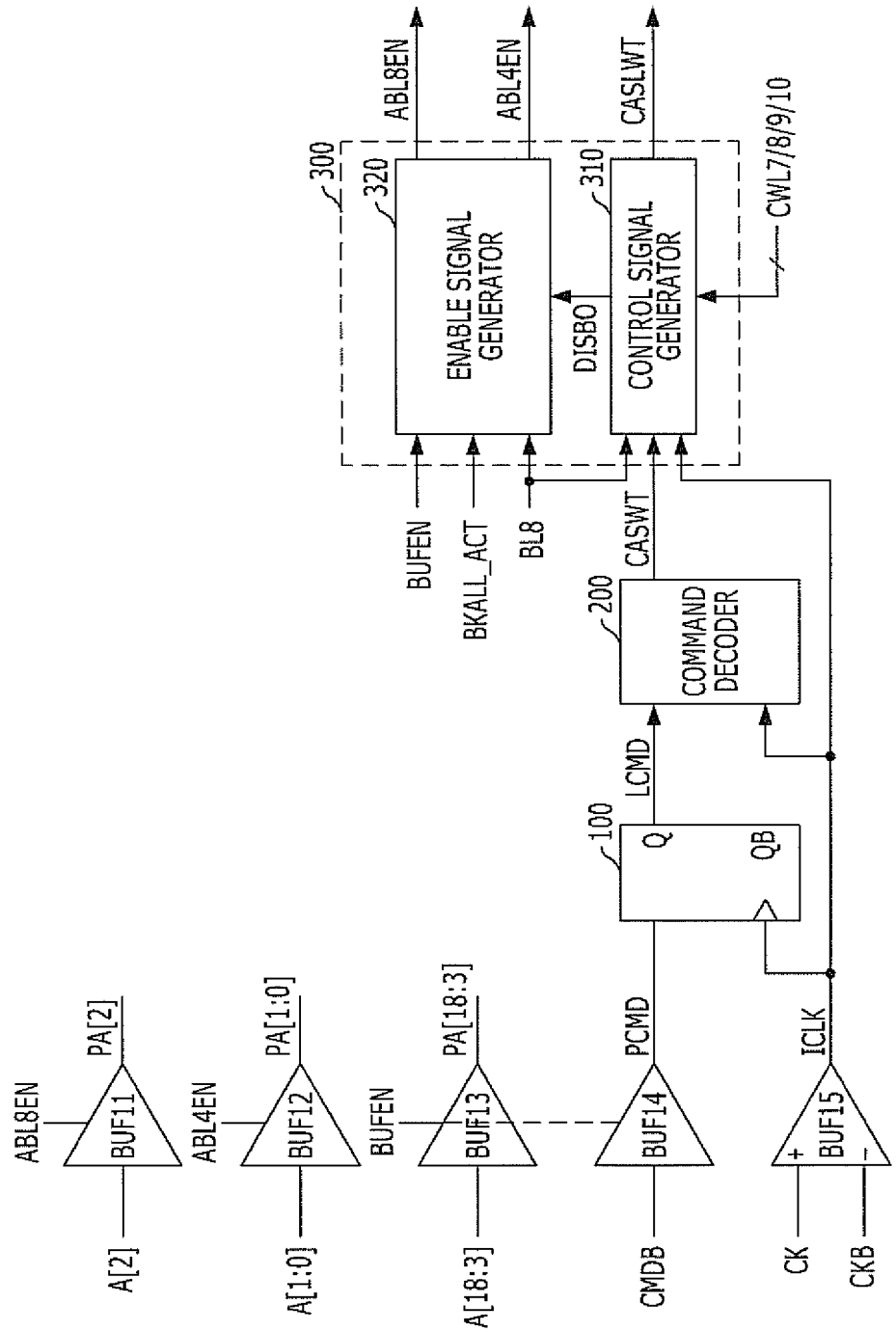
FIG. 4 is a block view illustrating a semiconductor memory device in accordance with an embodiment of the present invention.

FIG. 4 is a block view illustrating a semiconductor memory device in accordance with an embodiment of the present invention.

Referring to FIG. 4, the semiconductor memory device includes a first address buffer BUF11, a second address buffer BUF12, a third address buffer BUF13, a command buffer BUF14, a clock buffer BUF15, a latch 100, a command decoder 200, and a control circuit 300.

The first address buffer BUF11 receives a second address A<2> among a plurality of addresses A<2:0> related to burst ordering and is selectively enabled according to a first enable signal ABL8EN during a write operation mode. The second address buffer BUF12 receives 0$^{th}$ and first addresses A<1:0> among the addresses A<2:0> related to burst ordering and is selectively disabled according to a second enable signal ABL4EN during a write operation mode. The third address buffer BUF13 receives addresses A<18:> other than the addresses A<2:0> related to burst ordering and is continuously enabled according to a third enable signal BUFEN. The command buffer BUF14 receives an external command CMDB. The clock buffer BUF15 generates an internal clock ICLK by buffering external clocks CK and CKB. The latch 100 latches an external command PCMD that are buffered through the command buffer BUF14. The command decoder 200 generates a write command CASWT by decoding an external command LCMD latched to the latch 100. The control circuit 300 generates the first enable signal ABL8EN and the second enable signal ABL4EN in response to the write command CASWT, an active signal BKALL_ACT, a burst length information BL8, CAS write latency information CWL7, CWL8, CWL9 and CWL10, and the third enable signal BUFEN. Here, the embodiment shows one second address buffer BUF12 and one third address buffer BUF13 for illustration purposes, but the number of buffers may equal the number of the addresses A<1:0> and A<18:3> to respectively correspond to the addresses A<1:0> and A<18:3> in one-to-one just as the first address buffer BUF11 does.

Here, the control circuit 300 selectively disables all or a part of the address buffers BUF11 and BUF12 that are related to burst ordering based on the burst length information BL8, when the write command CASWT is applied in a state that all banks are in an enabled state, that is, when an active signal BKALL_ACT is in an enabled state. The control circuit 300 includes a control signal generator 310 and an is enable signal generator 320. The control signal generator 310 generates a control signal DISB0 that is enabled during a certain period which ranges from a moment when the external command CMDB is inputted to a moment when the input of a data (not shown) corresponding to the burst length information BL8 is terminated in response to the burst length information BL8, the CAS write latency information CWL7, CWL8, CWL9 and CWL10, the write command CASWT, and the internal clock ICLK. The enable signal generator 320 generates the first enable signal ABL8EN and the second enable signal ABL4EN whose enabling periods are restricted differently in response to the control signal DISB0, the third enable signal BUFEN, the burst length information BL8, and the active signal BKALL_ACT and provides them to the first address buffer BUF11 and the second address buffer BUF12.

Figure 5:
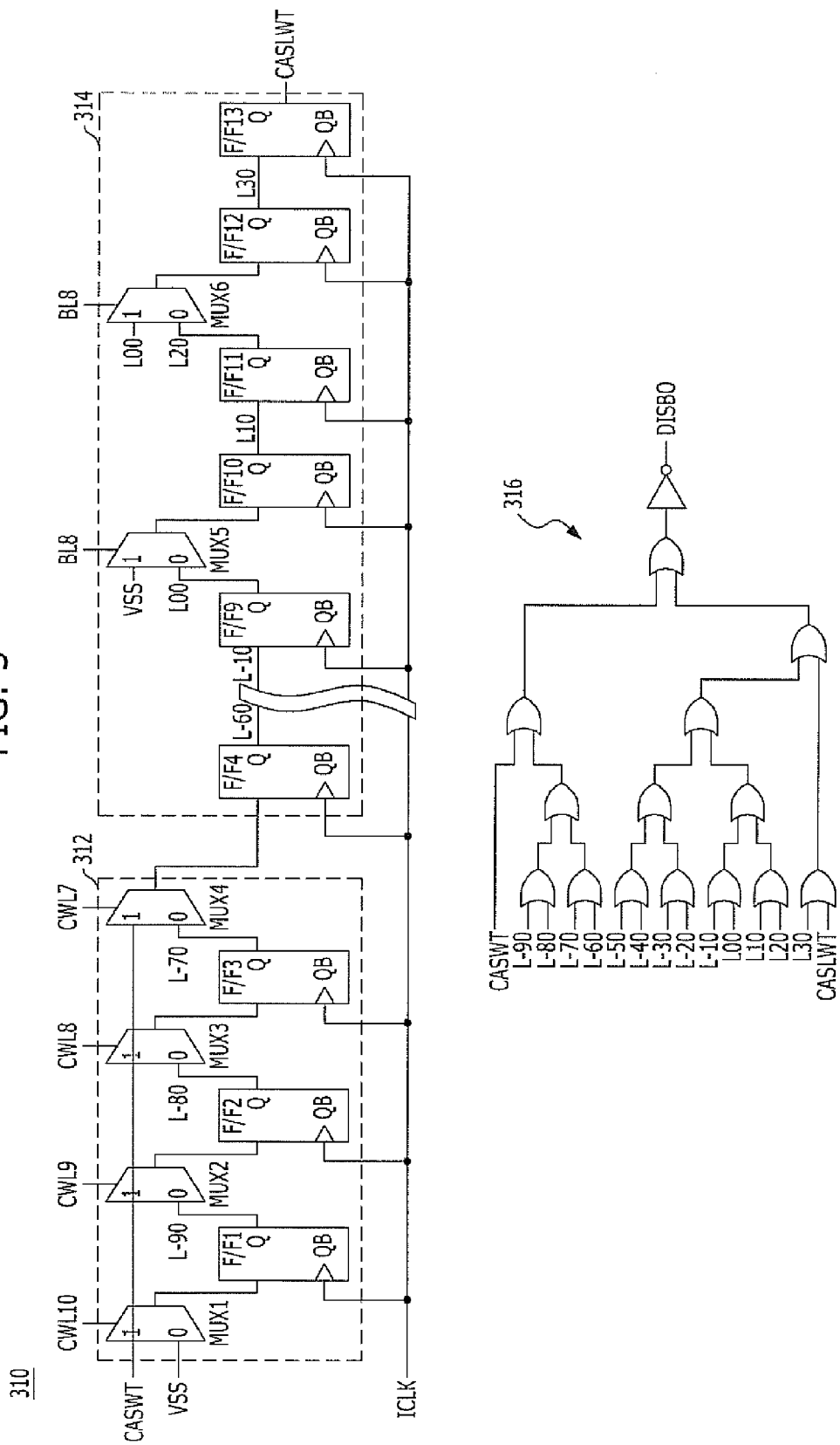
FIG. 5 is a block diagram illustrating a control signal generator shown in FIG. 4.
Figure 6:
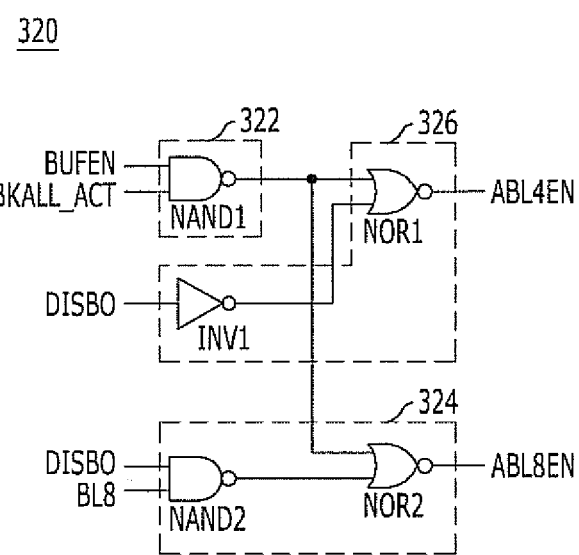
FIG. 6 is a block diagram illustrating an enable signal generator shown in FIG. 4.

Meanwhile, FIG. 5 is a block diagram illustrating the control signal generator 310 shown in FIG. 4, and FIG. 6 is a block diagram illustrating an enable signal generator 320 shown in FIG. 4.

Referring to FIG. 5, the control signal generator 310 includes a first shifting unit 312, a second shifting unit 314, and a first logic operation unit 316. The first shifting unit 312 sequentially shifts the write command CASWT for a number of times equal to a first shifting number that is controlled based on the CAS write latency information CWL7, CWL8, CWL9 and CWL10. The second shifting unit 314 sequentially shifts the shifted write command additionally for a number of times equal to a second shifting number that is controlled based on the burst length information BL8. The first logic operation unit 316 generates the control signal DISB0 by performing a logic operation on the write command CASWT and a plurality of write commands CASWT L-90 to L30 that are sequentially shifted in the first and second shifting units.

Here, the first shifting unit 312 includes four multiplexers MUX1, MUX2, MUX3 and MUX4 and three D-flip-flops F/F1 to F/F3. The four multiplexers MUX1, MUX2, MUX3 and MUX4 select and output a write command CASWT based on the CAS write latency information CWL7, CWL8, CWL9 and CWL10. The three D-flip-flops F/F1 to F/F3 are provided to respectively correspond to the four multiplexers MUX1, MUX2, MUX3 and MUX4 and shift the outputs of the multiplexers MUX1, MUX2 and MUX3 in the front portion and transfer the shifted outputs as inputs of the next multiplexers MUX2, MUX3 and MUX4. Meanwhile, the first multiplexer MUX1 disposed in the foremost part of the first to fourth multiplexers MUX1, MUX2, MUX3 and MUX4 take a ground voltage VSS as its input. The first shifting unit 312 outputs a write command CASWT through any one among the first to fourth multiplexers MUX1, MUX2, MUX3 and MUX4 based on the CAS write latency information CWL7, CWL8, CWL9 and CWL10, and outputs the primarily shifted write command through the fourth multiplexer MUX4 in the rearmost part.

The second shifting unit 314 includes a D-flip-flop chain F/F4 to F/F13 and skip units MUX5 and MUX6. The D-flip-flop chain F/F4 to F/F13 outputs a plurality of write commands CASLWT L-60 to L30 by secondarily shifting the write command outputted from the fourth multiplexer MUX4. The skip units MUX5 and MUX6 skips a portion of the D-flip-flop chain F/F4 to F/F13 based on the burst length information BL8. Here, the number of the D-flip-flops that constitute the D-flip-flop chain F/F4 to F/F13 corresponds to '8' which is the number of the largest burst length. The skip units MUX5 and MUX6 skip a number D-flip-flops corresponding to the difference of burst length. Since the burst length supports '8' and '4' in this embodiment of the present invention, the skip units MUX5 and MUX6 are realized to skip two D-flip-flops F/F10 and F/F11 since '2' corresponds to the difference of burst length '4'. The skip units MUX5 and MUX6 include a fifth multiplexer MUX5, which selects any one between the output L00 of a certain D-flip-flop F/F9 included in the D-flip-flop chain F/F4 to F/F13 based on the burst length information BL8 and outputs the selected output as an input of the next D-flip-flop F/F10, and a sixth multiplexer MUX6, which selects any one between the output L00 of a certain D-flip-flop F/F9 and the output L20 of a D-flip-flop F/F11 disposed two D-flip-flops behind the certain D-flip-flop F/F9 based on the burst length information BL8 and outputs the selected output as an input of the next D-flip-flop F/F12.

Also, the first logic operation unit 316 performs an OR operation on the write command CASWT, the shifted write commands CASLWT, and L-90 to L30, converts the operation result, and outputs the control signal DISB0.

Referring to FIG. 6, the enable signal generator 320 includes a second logic operation unit 322, a third logic operation unit 324, and a fourth logic operation unit 326. The second logic operation unit 322 performs a logic operation on the third enable signal BUFEN and the active signal BKALL_ACT. The third logic operation unit 324 performs a logic operation on an output signal of the second logic operation unit 322, the control signal DISB0, and the burst length information BL8 and outputs the first enable signal ABL8EN. The fourth logic operation unit 326 performs a logic operation on an output signal of the second logic operation unit 322 and the control signal DISB0 and outputs the second enable signal ABL4EN.

Here, the second logic operation unit 322 includes a first NAND gate NAND1 for performing a NAND operation on the third enable signal BUFEN and the active signal BKALL_ACT.

The third logic operation unit 324 includes a first inverter INV1 for inverting the control signal DISB0 and a first NOR gate NOR1 for performing a NOR operation on an output signal of the first inverter INV1 and an output signal of the second logic operation unit 322.

Also, the fourth logic operation unit 326 includes a second NAND gate NAND2 for performing a NAND operation on the control signal DISB0 and the burst length information BL8, and a second NOR gate NOR2 for performing a NOR operation on an output signal of the second NAND gate NAND2 and an output signal of the second logic operation unit 322.

Hereafter, a method for driving a semiconductor memory device having the above-described structure in accordance with an embodiment of the present invention is described with reference to FIGS. 7 and 8.

Figure 7:
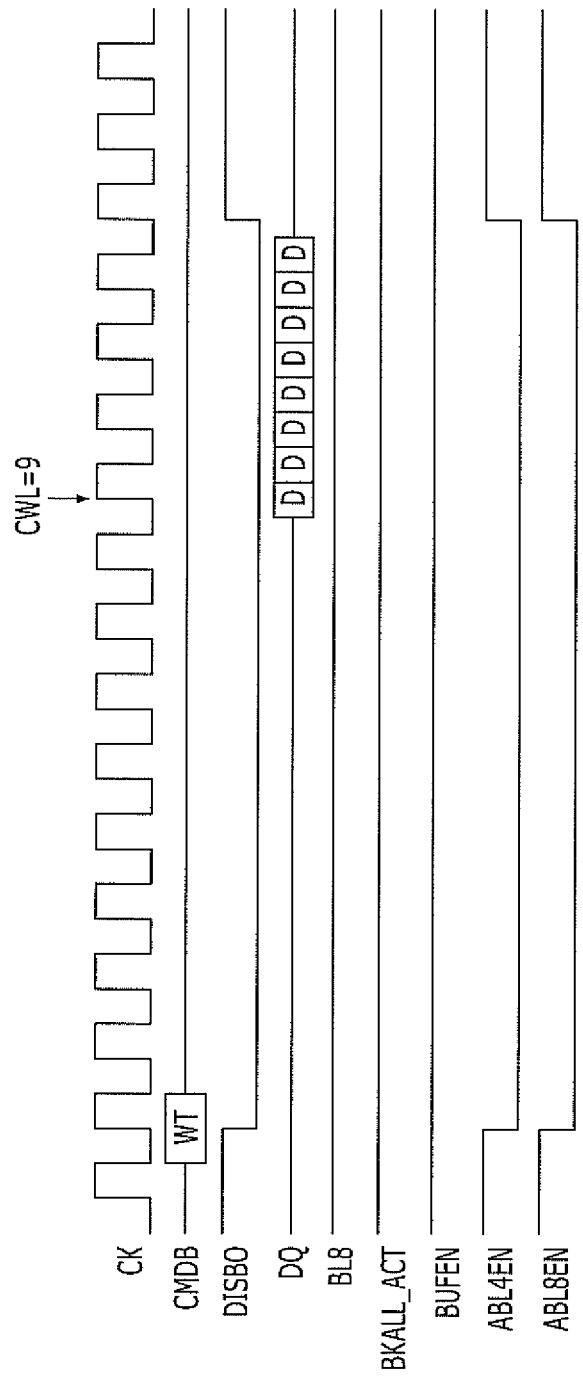
FIGS. 7 and 8 are timing diagrams describing a method for driving a semiconductor memory device in accordance with an embodiment of the present invention.

FIG. 7 is a timing diagram describing a semiconductor memory device operating in a write operation mode and a BL8 mode (a case where the burst length is 8) in accordance with an embodiment of the present invention. FIG. 7 is a timing diagram describing a semiconductor memory device operating in a write operation mode and a BL4 mode (a case where the burst length is 4) in accordance with an embodiment of the present invention.

In this embodiment of the present invention, it is assumed that the CAS write latency information is '9'. Here, the CAS write latency information of '9' means that data begins to be inputted through the data pad DQ after a write command is inputted and 9 cycles (9tCK) of a clock passes.

First, a case of the BL8 mode is described herein.

Referring to FIG. 7, when the active signal BKALL_ACT is enabled to a logic high level (all banks are in an enabled state) and the external command CMDB is applied, the received external command CMDB is latched to the latch 100 in synchronization with the internal clock ICLK, and the latched external command LCMD is decoded by the command decoder 200 into a write command CASWT.

The control signal generator 310, then, generates the control signal DISB0 in response to the write command CASWT, the CAS write latency information CWL9, and the burst length information BL8. The process of generating the control signal DISB0 is described in detail herein. The first shifting unit 312 receives the write command CASWT that is outputted through the second multiplexer MUX2 based on the CAS write latency information CWL9 and outputs a plurality of write commands L-80 and L-70 that are primarily shifted through two D-flip-flops F/F2 and F/F3. The second shifting unit 314 sequentially shifts the corresponding write command L-60 based on the burst length information BL8 of a logic high level through the D-flip-flops F/F4 to F/F13 without a skip and outputs a plurality of write commands CASLWT L-60 to L30 that are secondarily shifted. As a result, the first logic operation unit 316 generates the control signal DISB0 by performing a NOR operation on a plurality of shifted write commands CASLWT L-90 to L-30 that are outputted through the first shifting unit 312 and the second shifting unit 314 and the write command CASWT. The generated control signal DISB0 is enabled in a period from a moment when the external command CMDB is inputted to a moment when the input of a data having a burst length of '8' is completed. In short, the enabling period of the control signal DISB0 is defined as a sum of a period (9tCK) corresponding to a CAS write latency of '9' and a period (4tCK) corresponding to a burst length of '8'.

Meanwhile, the enable signal generator 320 generates the first enable signal ABL8EN and the second enable signal ABL4EN that are disabled in the period where the control signal DISB0 is enabled based on the burst length information BL8 of a logic high level.

Therefore, the first address buffer BUF11 and the second address buffer BUF12 are disabled in the period where the control signal DISB0 is enabled in response to the first enable signal ABL8EN and the second enable signal ABL4EN. Here, since the $0^{th}$ to second addresses A<2:0> are not involved in the control of burst ordering in the write operation mode and the BL8 mode, the first address buffer BUF11 and the second address buffer BUF12 for buffering the $0^{th}$ to second addresses A<2:0> are disabled.

Hereinafter, a case of the BL4 mode is described.

Figure 8:
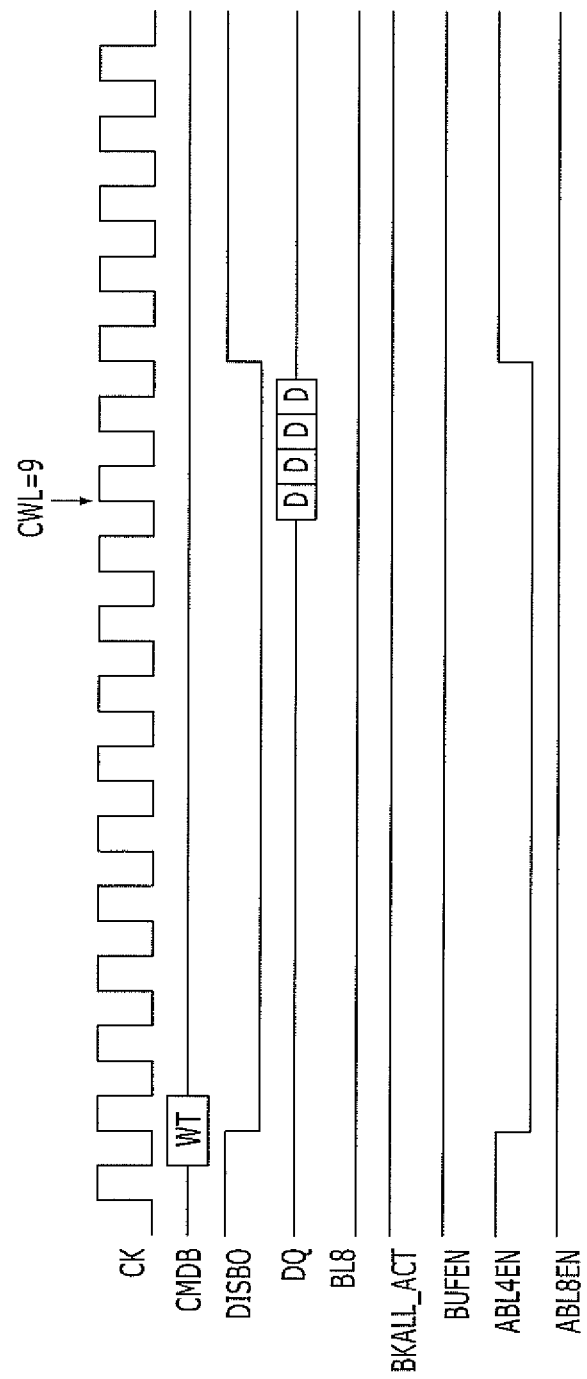

Referring to FIG. 8, when the active signal BKALL_ACT is enabled to a logic high level (all banks are in an enabled state) and the external command CMDB is applied, the received external command CMDB is latched to the latch 100 in synchronization with the internal clock ICLK, and the latched external command LCMD is decoded by the command decoder 200 into an external command CMDB.

The control signal generator 310, then, generates the control signal DISB0 in response to the external command CMDB, the CAS write latency information CWL9, and the burst length information BL8. The process of generating the control signal DISB0 is described in detail herein. The first shifting unit 312 receives the external command CMDB that is outputted through the second multiplexer MUX2 based on the CAS write latency information CWL9 and outputs a plurality of write commands L-80 and L-70 that are primarily shifted through two D-flip-flops F/F2 and F/F3. The second shifting unit 314 sequentially shifts the corresponding write command L-60 based on the burst length information BL8 of a logic low level through the D-flip-flop chain F/F4 to F/F9, F/F12, and F/F13 part of which D-flip-flops F/F10 and F/F11 are skipped and outputs a plurality of write commands CASLWT L-60 to L00 and L30 that are secondarily shifted. As a result, the first logic operation unit 316 generates the control signal DISB0 by performing a NOR operation on the write command CASWT and the output signals CASLWT L-90 to L-30 that are outputted from the first shifting unit 312 and the second shifting unit 314. The generated control signal DISB0 is enabled in a period from a moment when the external command CMDB is inputted to a moment when the input of a data having a burst length of '4' is completed. In short, the enabling period of the control signal DISB0 is defined as a sum of a period (9tCK) corresponding to a CAS write latency of '9' and a period (2tCK) corresponding to a burst length of '4'.

Meanwhile, the enable signal generator 320 generates the first enable signal ABL8EN that maintains the enabled state based on the burst length information BL8 of a logic low level and the second enable signal ABL4EN that is disabled in the period where the control signal DISB0 is enabled.

Therefore, the first address buffer BUF11 maintains its enabled state in response to the first enable signal ABL8EN, and the second address buffer BUF12 is disabled in the period where the control signal DISB0 is enabled in response to the second enable signal ABL4EN. Here, since the $0^{th}$ to first addresses A<1:0> do not involve in the control of burst ordering in the write operation mode and the BL4 mode except the second address A<2>, the second address buffer BUF12 for buffering the $0^{th}$ and first addresses A<1:0> is disabled, except the first address buffer BUF11 for buffering the second address A<2>.

According to an embodiment of the present invention, the buffers that are not used during a write operation mode are disabled to save power consumption. Moreover, the power consumption may be minimized as the buffers that are not used are selectively disabled according to a burst length during a write operation mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of address input blocks configured to respectively receive a plurality of addresses that are related to burst ordering; and
   a control circuit configured to selectively disable all or a part of the address input blocks in response to burst length information during a write operation mode.

2. The semiconductor memory device of claim 1, wherein the control circuit comprises:
   a control signal generator configured to generate a control signal that is enabled during a first period in response to the burst length information, a write command, CAS write latency information, and a clock; and
   an enable signal generator configured to generate a plurality of enable signals whose enabling periods are restricted in response to the control signal and the burst length information and provide the enable signals to the address input blocks, respectively.

3. The semiconductor memory device of claim 2, wherein the first period ranges from a point of time when the write command is inputted from outside to a point of time when an input of a data corresponding to the burst length information is completed.

4. The semiconductor memory device of claim 2, wherein the control signal generator comprises:
   a first shifting unit configured to sequentially shift the write command for a number of times equal to a first shifting number to produce a primarily shifted write command, wherein the first shifting number is controlled in response to the CAS write latency information;
   a second shifting unit configured to sequentially shift the primarily shifted write command for a number of times equal to a second shifting number, wherein the second shifting number is controlled in response to the burst length information; and
   a logic operation unit configured to generate the control signal by performing a logic operation on the write command and a plurality of write commands that are obtained from the sequential shifting in the first shifting unit and the second shifting unit.

5. The semiconductor memory device of claim 4, wherein the first shifting unit comprises:
   N multiplexers configured to select and output the write command based on the respective CAS write latency information, wherein N is the same as the number of the respective CAS write latency information and the N multiplexers are connected in series; and
   N–1 D-flip-flops configured to shift and transfer outputs of a corresponding ones of the N multiplexers as inputs for the subsequent multiplexers, respectively,
   wherein a foremost multiplexer among the N multiplexers in order is configured to receive a ground voltage as an input.

6. The semiconductor memory device of claim 4, wherein the second shifting unit comprises:
   a D-flip-flop chain configured to sequentially shift a write command that is outputted from a rearmost multiplexer among the N multiplexers; and
   a skip unit configured to skip a part of the D-flip-flop chain in response to the burst length information.

7. The semiconductor memory device of claim 4, wherein the logic operation unit is configured to perform a NOR operation.

8. The semiconductor memory device of claim 2, further comprising:
   a command input block configured to receive an external command;
   a latch configured to latch the external command received in the command input block; and
   a command decoder configured to generate the write command by decoding the latched external command that is obtained in the latch.

9. A semiconductor integrated circuit, comprising:
   at least one first address input block configured to receive a part of a plurality of addresses that are related to burst ordering and to be selectively enabled in response to a first enable signal in a write operation mode;
   at least one second address input block configured to receive the other part of the addresses that are related to burst ordering and to be selectively disabled in response to a second enable signal in the write operation mode;

at least one third address input block configured to receive addresses other than the addresses that are related to burst ordering and to be continuously enabled in response to a third enable signal in the write operation mode;

a control signal generator configured to generate a control signal that is enabled in a first period in response to a burst length information, CAS write latency information, a write command, and a clock; and an enable signal generator configured to generate a first enable signal and a second enable signal in response to the control signal, the third enable signal, the burst length information, and an active signal, which is a signal enabled when all banks are in an active state.

10. The semiconductor integrated circuit of claim 9, wherein the first period starts from a point of time when the write command is inputted from outside to a point of time when an input of a data corresponding to the burst length information is completed.

11. The semiconductor integrated circuit of claim 9, wherein the control signal generator comprises:
a first shifting unit configured to sequentially shift the write command for a number of times equal to a first shifting number that is controlled in response to the CAS write latency information to produce a primarily shifted write command;
a second shifting unit configured to sequentially shift the primarily shifted write command as additionally for a number of times equal to a second shifting number that is controlled in response to the burst length information; and
a logic operation unit configured to generate the control circuit by performing a logic operation on the write command and a plurality of write commands that are obtained from the sequential shifting in the first shifting unit and the second shifting unit.

12. The semiconductor integrated circuit of claim 11, wherein the first shifting unit comprises:
N multiplexers configured to select and output the write command in response to the respective CAS write latency information, wherein N is the same as the number of the respective CAS write latency information and the N multiplexers are connected in series; and
N−1 D-flip-flops configured to shift and transfer outputs of corresponding one of the N multiplexers as inputs for the next multiplexers, respectively,
wherein a foremost multiplexer among the N multiplexers receives a ground voltage as an input.

13. The semiconductor integrated circuit of claim 12, wherein the second shifting unit comprises:
a D-flip-flop chain configured to sequentially shift a write command that is outputted from a rearmost multiplexer among the N multiplexers; and
a skip unit configured for skip a part of the D-flip-flop chain in response to the burst length information.

14. The semiconductor integrated circuit of claim 12, wherein the logic operation unit is configured to perform a NOR operation.

15. The semiconductor integrated circuit of claim 9, wherein the enable signal generator comprises:

a second logic operation unit configured to perform a logic operation on the third enable signal and the active signal;

a third logic operation unit configured to perform a logic operation on an output signal of the second logic operation unit, the control signal and the burst length information and output the first enable signal; and a fourth logic operation unit configured to perform a logic operation on the output signal of the second logic operation unit and the control signal and output the second enable signal.

16. The semiconductor integrated circuit of claim 9, further comprising:
a command input block configured to receive an external command;
a latch configured to latch the external command received in the command input block; and
a command decoder configured to generate the write command by decoding the latched external command that is obtained in the latch.

17. A method for driving a semiconductor memory device that includes at least one first address input block and at least one second address input block that are continuously enabled according to a first enable signal and a second enable signal in a read operation mode, the method comprising:
when all banks are in an enabled state and a write command is inputted from outside, maintaining the first enable signal in an enabled state or transitioning the first enable signal from an enabled state to a disabled state in response to a burst length information, and transitioning the second enable signal from an enabled state to a disabled state in response to the burst length information; and
when an input of a data corresponding to the burst length information from outside is completed, maintaining the first enable signal in an enabled state or transitioning the first enable signal from a disabled state to an enabled state, and transitioning the second enable signal from a disabled state to an enabled state.

18. The method of claim 17, wherein the maintaining of the first enable signal in the enabled state or transitioning the first enable signal from the enabled state to the disabled state in response to the burst length information, and transitioning the second enable signal from the enabled state to the disabled state based on the burst length information includes maintaining the first enable signal in the enabled state in response to the burst length information when burst length is '4'.

19. The method of claim 17, wherein the maintaining of the first enable signal in the enabled state or transitioning the first enable signal from the enabled state to the disabled state in response to the burst length information, and transitioning the second enable signal from the enabled state to the disabled state in response to the burst length information includes transitioning the first enable signal from the enabled state to a disabled state in response to the burst length information when burst length is '8'.

20. The method of claim 17, wherein a period where the first enable signal and the second enable signal are maintained in the disabled state is a sum of a period corresponding to a CAS write latency and a period corresponding to a burst length.

* * * * *